United States Patent [19]

Pfiester

[11] Patent Number: 5,264,380
[45] Date of Patent: Nov. 23, 1993

[54] METHOD OF MAKING AN MOS TRANSISTOR HAVING IMPROVED TRANSCONDUCTANCE AND SHORT CHANNEL CHARACTERISTICS

[75] Inventor: James R. Pfiester, Austin, Tex.
[73] Assignee: Motorola, Inc., Schaumburg, Ill.
[21] Appl. No.: 452,017
[22] Filed: Dec. 18, 1989
[51] Int. Cl.⁵ .......................................... H01L 21/336
[52] U.S. Cl. ........................................ 437/37; 437/41; 437/44
[58] Field of Search .................. 437/37, 27, 28, 29, 437/30, 34, 40, 41, 44, 56, 57, 24, 26, 164, 233, 235, 238, 240; 357/23.1, 23.3, 23.12, 23.15, 23.14, 91; 257/336, 344

[56] References Cited

U.S. PATENT DOCUMENTS

| | | | |
|---|---|---|---|
| 3,328,210 | 6/1967 | McCaldin et al. | 437/37 |
| 3,442,721 | 5/1969 | McCaldin et al. | 148/33 |
| 3,607,449 | 9/1971 | Tokuyama | 437/37 |
| 3,657,614 | 4/1972 | Cricchi | 357/41 |
| 3,956,025 | 5/1976 | Statz et al. | 357/91 |
| 3,972,059 | 7/1976 | DiStefano | 357/6 |
| 3,983,574 | 9/1976 | Statz et al. | 357/91 |
| 4,043,024 | 8/1977 | Iwamatsu | 437/37 |
| 4,047,974 | 9/1977 | Harari | 437/37 |
| 4,048,350 | 9/1977 | Glang | 437/235 |
| 4,258,077 | 3/1981 | Mori | 437/41 |
| 4,306,352 | 12/1981 | Schrader | 437/44 |
| 4,391,032 | 7/1983 | Schulte | 437/37 |
| 4,468,574 | 8/1984 | Engeler et al. | 357/23.3 |
| 4,714,519 | 12/1987 | Pfiester | 437/44 |
| 4,855,247 | 8/1989 | Ma et al. | 437/44 |
| 4,994,869 | 2/1991 | Matloubian et al. | 357/23.3 |
| 5,047,361 | 9/1991 | Matloubian et al. | 437/44 |
| 5,108,940 | 4/1992 | Williams | 437/44 |

FOREIGN PATENT DOCUMENTS

| | | | |
|---|---|---|---|
| 0064276 | 5/1977 | Japan . | |
| 0159066 | 10/1982 | Japan | 357/23.3 |
| 0177471 | 7/1988 | Japan | 357/23.3 |
| 0187664 | 8/1988 | Japan | 357/23.3 |
| 2028582 | 5/1980 | United Kingdom . | |

OTHER PUBLICATIONS

Sze, *Semiconductor Devices*, 1985, pp. 197–200.
Hino et al., "Neutralization of Mobile Ions in the SiO₂ Film of MOS Structures", J. Appl. Phys., vol. 50, No. 7, Jun. 1979, pp. 4879–4882.
Snow et al., "Ion Transport Phenomena in Insulating Films", J. Appl. Phys., vol. 36, No. 5, May 1965, pp. 1664–1673.
"The Implact of Gate-Drain Overlapped LDD (GOLD) for Deep Submicron VLSI'S", R. Izawa, et al., IEDM Tech. Digest, 1987, p. 38.
"A Novel Submicron LDD Transistor with Inverse-T Gate Structure", T. Y. Haung et al., IEDM Techn. Digest, 1986, p. 742.
"A Low-Temperature NMOS Technology with Cesium-Implanted Load Devices", J. T. Watt, et al., IEEE Trans. Electron Devices, ED-34 (1), 1987, p. 28.
"Characterization of Surface Mobility in MOS Structures Containing Interfacial Cesium Ions", J. T. Watt, et al., IEEE Trans. Electron Devices, 36 (1), 1989, p. 96.
"An Optimized 0.5 Micron LDD Transistor", S. Rathman. et al., IEDM Tech. Digest, 1983, p. 237.
"A Half Micron MOSFET Using Double Implanted LDD", S. Ogura, et al., IEDM Tech. Digest, 1982, p. 718.

*Primary Examiner*—Mary Wilczewski
*Attorney, Agent, or Firm*—Jasper W. Dockrey

[57] ABSTRACT

A transistor is described having reduced series resistance and a reduced peak lateral electric field. The peak lateral field is reduced by forming an image charge in the surface of the substrate underlying the edges of the transistor gate electrode. The image charge is created by impregnating portions of an oxide layer overlying the source and drain regions with an impurity having the same conductivity as that of the underlying substrate. The depletion region formed in the substrate by the image charge provides a graduated electric filed in the channel preventing hot carrier injection into the gate oxide and increasing the breakdown voltage. The image charge is of an opposite conductivity to that of the substrate and is thus composed of minority carriers. The high concentration of majority carriers near the surface of the substrate lower the series resistance of the transistor thereby increasing the drive current.

8 Claims, 2 Drawing Sheets

METHOD OF MAKING AN MOS TRANSISTOR HAVING IMPROVED TRANSCONDUCTANCE AND SHORT CHANNEL CHARACTERISTICS

BACKGROUND OF THE INVENTION

The invention relates in general to the fabrication of semiconductor integrated circuit devices and more particularly to VLSI MOS transistors resistant to performance degradation resulting from short channel effects.

A major problem hindering the further size reduction of metal-oxide-semiconductor (MOS) transistor devices is the loss of performance which is characteristic of transistors having channel lengths less than 0.8 micron. The performance degradation includes but is not limited to low source-drain breakdown voltage, subthreshold leakage, increased junction capacitance and threshold voltage instability. These problems, known collectively as short channel effects, are related to the electrodynamics of the transistor channel during operation. In the scaling of transistor dimensions to smaller values, an attempt is made to either keep the internal electric fields constant, or maintain long channel characteristics by subduing the subthreshold drain current as the drain voltage is increased. Both methods require adjusting the electric field in the channel such that the peak lateral electric field of the drain depletion region is minimized.

A simple and effective technique to reduce the peak lateral field is to lower the supply voltage to the transistor. This solution, while effective, has not been adapted by integrated circuit manufacturers because a majority of the other components used by IC consumers operate with a standard 5 volt supply. The reluctance of IC manufactures to reduce power supply voltages has led to a number of techniques for minimizing short channel effects in sub-micron transistors, the most common being the lightly-doped drain (LDD) structure. A conventional LDD structure comprises an N−region in proximity to the transistor channel and an N+region displaced away from the channel by the width of the N−region. As the length of the transistor channel is reduced, transistors fabricated using a conventional LDD structure show increased substrate current (ISUB) and lower breakdown voltages (BVDSS). A reduction of the dopant concentration in the N−region improves ISUB and BVDSS however, other parameters such as threshold voltage stability and drive current are degraded because impact ionization and series resistance both increase. The failure of the conventional LDD structure in preventing performance degradation due to short channel effects in 0.5 micron transistors led to the development of channel doping modification techniques such as the double implanted LDD as described by S. Orura, et al., IEDM Tech. Digest, p. 718, 1982 and the triple diffused LDD structure, described by S. Rathman, et al., IEDM Tech. Digest, p. 237, 1983. Both techniques employ sidewall spacers to shift the peak lateral electric field away from the channel region and counter dope the interface between the source and drain regions and the channel. The introduction of minority carriers into the perimeter of the channel, however, diminishes the ability of the gate to modulate the electric field within the channel region thereby reducing the transconductance (Gm) of the transistor.

The reduction of the N−doping level in the LDD structure is essential to maintain a high BVDSS in a sub-half micron N-channel transistor. Recently modified-gate LDD structures have been developed that preserve the improved short channel characteristics of the LDD structure and avoid transistor performance degradation. The modified structures include the gate-drain-overlapped LDD (GOLD) described by R. Izawa, et al., IEDM Tech. Digest, p. 38, 1987 and the inverse-TLDD (ITLDD) transistor described by T. W. Huang, et al., IEDM Tech. Digest, p. 742, 1986. Both structures seek to bring the N−region under gate control by overlapping the gate and reducing the N−dopant concentration of the LDD structure. A low series resistance is maintained because the overlapped gate can effectively accumulate the underlying N−region. Collectively known as a fully overlapped gate-drain, these techniques change the shape of the convention polysilicon transistor gate by creating thin gate extensions that overlie the N−region of the LDD structure. Although the modified gate techniques allow a reduced N−doping, the fabrication of sub-micron transistors using either the GOLD process or the ITLDD process involve difficult etch steps to create the gate extensions.

Accordingly, a need existed for a reliable sub-micron LDD transistor structure having a reduced N−dopant concentration to retain immunity to short channel effects and to retain a high Gm. Further, a need existed for a reliable process having a reduced number of process steps to produce such a structure.

BRIEF SUMMARY OF THE INVENTION

An object of the invention is to provide an MOS transistor structure having reduced peak lateral electric field and reduced series resistance.

A further object of the invention is to provide a means of exerting control over the electric fields within a transistor channel region without introducing dopant atoms in direct proximity to the channel region.

The foregoing and other objects and advantages of the invention are achieved through an MOS transistor and a method for its fabrication in which the gate oxide of the transistor is impregnated with an impurity species having an electric charge of similar polarity to the underlying substrate. In accordance with one embodiment of the invention, a semiconductor substrate of a first conductivity type is provided having a gate oxide formed thereon. A transistor gate electrode is formed to overlie a portion of the gate oxide leaving an exposed portion on either side of the gate electrode. Impurity atoms of the first conductivity type are introduced into the gate oxide layer on either side of the gate electrode using the gate electrode as a blocking mask. The electric charge of the impurity atoms in the oxide layer induce a charge of opposite polarity in the surface of underlying substrate. A sidewall spacer is formed on the gate electrode and source and drain regions of a second conductivity type are formed in the substrate aligned to the edge of the sidewall spacer.

DETAILED DESCRIPTION OF THE PREFERRED EMBODIMENTS

FIGS. 1-5 illustrate, in cross section, process steps in accordance with one embodiment of the invention whereby an MOS transistor is formed having improved gain and enhanced immunity to short channel effects. Such a transistor could be used for example, in a DRAM or SRAM, or other integrated circuit structure. In the following description, the invention is illustrated by a process in which a N-channel MOS transistor is formed. It is to be understood that in a similar manner a P-channel transistor can also be formed by selecting species and materials of the opposite polarity and conductivity type.

Figure 1:
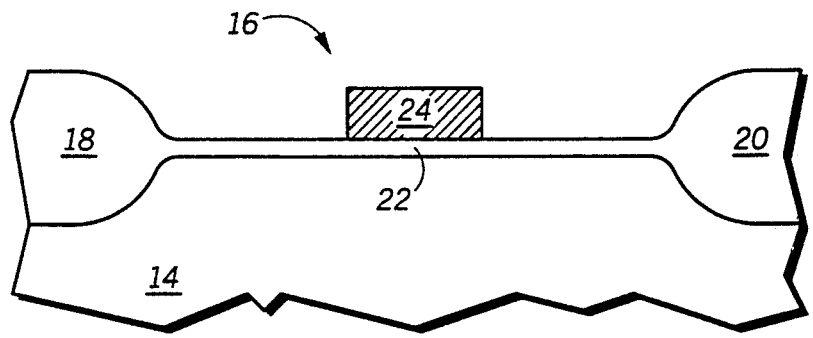
FIGS. 1-5 illustrate, in cross-section, process steps in accordance with one embodiment of the invention.

Shown in FIG. 1, in cross section, is a portion 10 of a P-type semiconductor substrate 14 having already undergone some of the process steps in accordance with the invention. An active region 16 is bounded by isolation regions 18 and 20. A gate oxide layer 22 overlies active region 16 and a gate electrode 24 is formed to overlie gate oxide layer 22 in a central portion of active region 16. Gate electrode 24 is formed from a conductive material such as polysilicon, or a refractory metal silicide such as tungsten silicide, titanium silicide, cobalt silicide or the like. Preferably, substrate 14 comprises single crystal silicon doped with an acceptor atom to make substrate 14 P-type conductive. Alternatively, substrate 14 can be formed from an epitaxial layer of silicon formed on a suitable semiconductor substrate.

Figure 2:
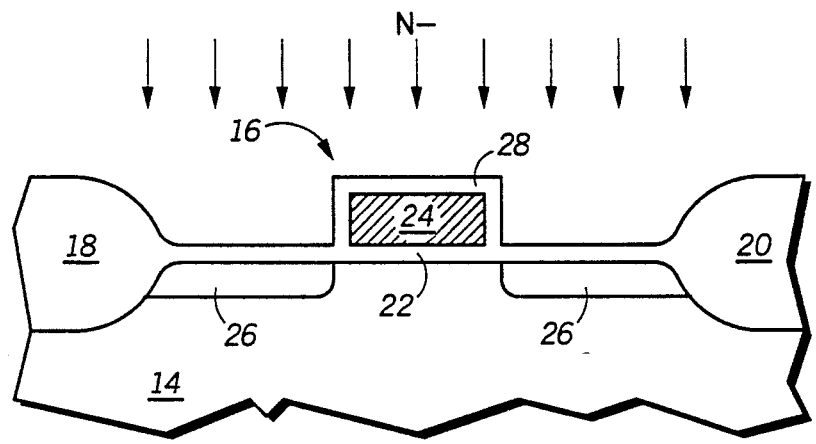

In accordance with one embodiment of the invention, an oxidation process is carried out to form an oxide layer 28, shown in FIG. 2, overlying gate electrode 24 and those portions of substrate 14 where source and drain regions will be formed. The oxidation process regrows portions of gate oxide layer 22 that were removed during the etch process used to form gate electrode 24. Additionally, the oxidation process consumes a small amount of gate electrode 24 resulting in smoothing and rounding the corners of gate electrode 24. Sharp corners on gate electrode 24 are undesirable because electric field lines are focused at these locations and can result in transistor performance degradation. The amount of oxidation required depends on the specific polysilicon etch process used. It is to be understood that the oxidation process described above is optional, and that given an anisotropic polysilicon etch process of sufficient selectivity the oxidation process may be omitted. Following the oxidation, an N−region 26 is formed in active region 16 using gate electrode 24 as a blocking mask. N−region 26 is formed by ion implantation or other means suitable to impart dopant atoms of N-type conductivity into substrate 14. N−region 26 is thus aligned to the edge of gate electrode 24.

Figure 3:
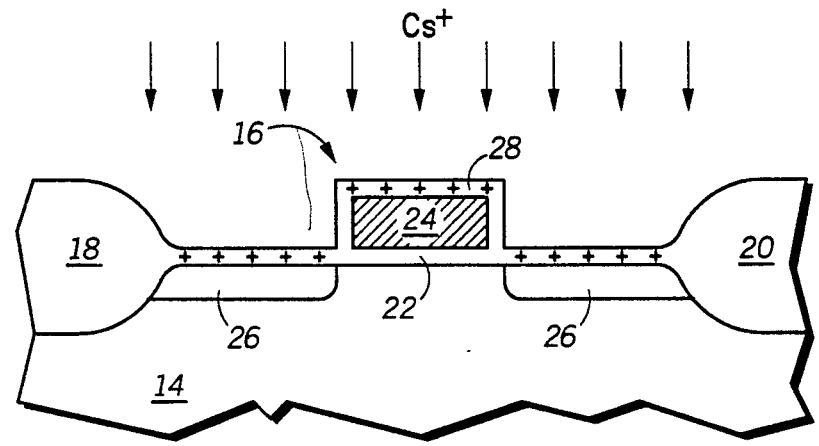

The inventive process continues with the formation of a positive charge in oxide layer 28, as shown in FIG. 3. The positive charge is imparted to oxide layer 28 by ion implantation of an electropositive element having a low electronegativity, small ionization potential and small diffusion coefficient in silicon oxide. In one embodiment the electropositive element is selected from a member of the alkali metals such as Rubidium or Cesium. Preferably, Cesium ions are implanted having a maximum concentration midway into oxide layer 28. The Cesium ions, (illustrated as + symbols in FIG. 3) created a positive potential in the implanted portions of gate oxide layer 22. The ability of Cesium ions, resident in a silicon oxide, to form a negative image charge in a semiconductor substrate is described by J. T. Watt, et al., IEEE Trans. Electron Devices, (36) 1, 1989.

Figure 4:
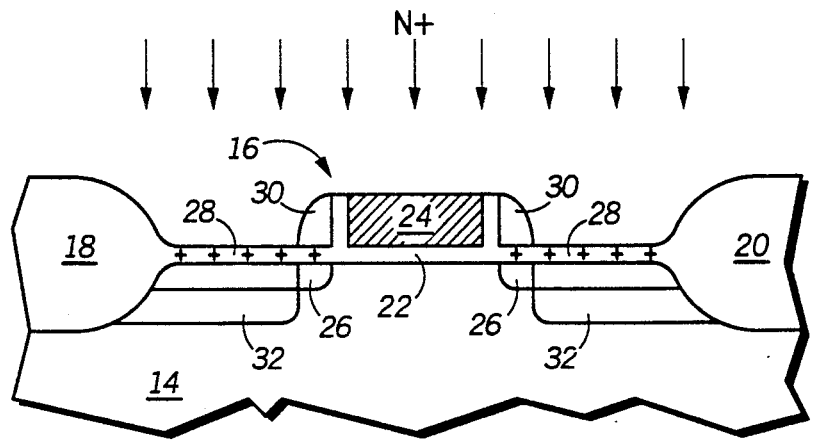

Referring to FIG. 4, after Cesium implantation of oxide layer 28, a sidewall spacer 30 is formed to overlie the edges of gate electrode 24 and extending over edge portions of N−region 26. Sidewall spacer 30 is formed for example, by first depositing a layer of silicon nitride or other material capable of resisting diffusion of a ionic species therethrough. Following deposition of the silicon nitride layer, anisotropic reactive ion etching is performed to substantially remove the silicon nitride from laterally disposed surfaces and leaving a portion of the silicon nitride layer overlying substantially vertical surfaces such as the edges of gate electrode 24. The anisotropic etch removes etchable material in the vertical direction more rapidly than in the horizontal direction. During the etching process the portion of oxide layer 28 overlying the top surface of gate electrode 24 is removed as a result of the less than perfect etch selectivity between oxide layer 28 and the silicon nitride used to form sidewall spacer 30. The selectivity of an etch process is defined as the etch rate of an overlying etchable layer to the etch rate of an underlying layer. In the present case, the selective removal of silicon nitride over oxide layer 28 is insufficient to prevent the complete removal of oxide layer 28 overlying gate electrode 24.

Once sidewall spacer 30 is in place, an N+region 32 is formed in active region 16 of substrate 14 using gate electrode 24, isolation regions 18 and 20 and sidewall spacer 30 as a blocking mask. N+region 32 is formed by ion implantation or other means suitable to impart dopant atoms of N-type conductivity into substrate 14. N+region 32, shown in FIG. 4, is aligned to the edge of sidewall spacer 30 and displaced away from the edges of gate electrode 24 by the width of sidewall spacer 30. As a result of the preceding process steps, N−region 26 is self-aligned to gate electrode 24 and N+region 32 is self-aligned to sidewall spacer 30.

Figure 5:
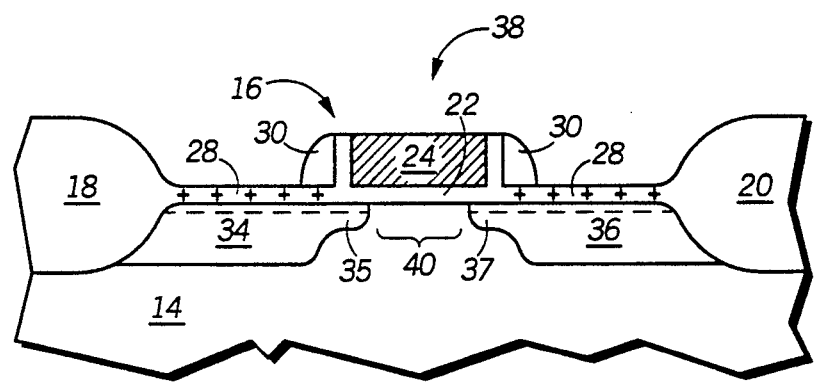

Subsequent to the formation of N+region 32, substrate 14 is subjected to thermal energy sufficient to activate the dopant atoms and form lightly doped source and drain regions 34 and 36 respectively, as illustrated in FIG. 5. The thermal energy imparted to substrate 14 provides sufficient activation energy to diffuse impurity atoms within substrate 14 and oxide layer 28. The thermal process laterally diffuses Cesium atoms within oxide layer 28 into portions of gate oxide layer 22 underlying the edges of gate electrode 24. The lateral diffusion of dopant atoms originally located in N−region 26 results in the formation of lightly doped lateral extensions 35 and 37 underlying the edge of gate electrode 24. The inventive process steps described above have resulted in the formation of an N-channel MOS transistor 38 in active region 16 having a Cesium enhanced lightly-doped drain (LDD) structure. Transistor 38 comprises gate electrode 24 overlying a channel region 40, source region 34 and drain region 36 with lateral extensions 35 and 37 respectively.

One skilled in the art will recognize that the electric fields in channel region 40 will be influenced by the electropositive charge present in oxide layer 28. The Cesium ions residing oxide layer 28 attract electrons from source and drain regions 34 and 36 to the interface of oxide layer 28 and substrate 14. The negative charge accumulation layer, (shown as −symbols in FIG. 5), improves the performance of transistor 38 over MOS transistors of the prior art by reducing the series resistance between source region 34 and drain region 36. The reduced series resistance leads to greater transconductance (Gm) and high drive current. Furthermore, the electric field associated with the electron accumulation layer induced by the Cesium ions permits the dopant atom concentration to be reduced in lateral extensions 35 and 37 relative to a conventional LDD transistor. An important advantage of the invention relates to the reduction of the N—dopant concentration by about one order of magnitude relative to a conventional LDD structure. A reduction in the dopant concentration of the lateral extensions shifts the peak lateral electric drain field away from channel 40, thereby increasing the breakdown voltage necessary to cause current conduction between source region 34 and drain region 36. The lateral depletion layer generated by the negative charge accumulation reduces impact ionization in channel 40 during operation of transistor 38. Less impact ionization occurring in channel 40 lowers the substrate current and leads to better threshold voltage stability by minimizing hot carrier injection into gate oxide 22.

While the invention has been described in connection with the formation of a lightly doped drain structure, one skilled in the art will appreciate that the invention is not necessarily so limited and that the formation of an image charge in the substrate can be applied to other structures. The inventive concept enables the formation of a depletion layer in the substrate of an active transistor device without imparting dopant atoms into the substrate. For example, active region 16 in which N-channel transistor 38 is formed has been doped to possess a P-type conductivity. The introduction of Cesium ions into oxide layer 28 overlying the source and drain regions of N-channel transistor 38 forms a natural electron inversion layer in the underlying substrate as electrons are attracted to the surface of substrate 14. The Cesium induced electron inversion layer acts as a lateral source/drain extension in an MOS transistor. The function of the induced depletion layer may be understood upon reference to FIG. 6.

Figure 6:
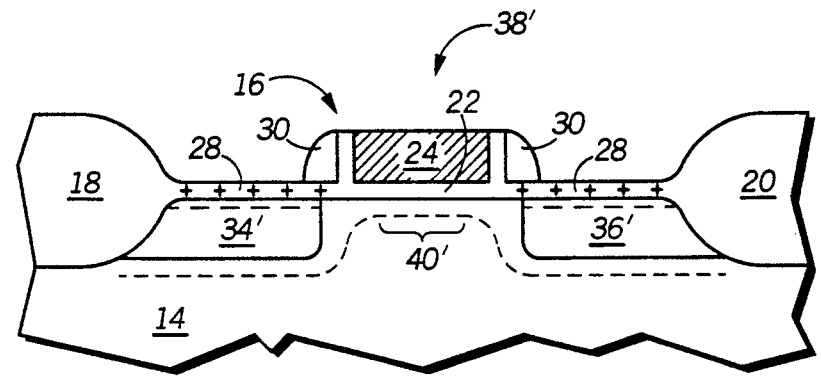
FIG. 6 illustrates, in cross-section, an improved MOS transistor having an oxide charge induced depletion layer and a graduated electric field in the channel region.

Referring to FIG. 6, the transistor structure shown in substantially like that of FIG. 5. For clarity, corresponding elements of FIGS. 5 and 6 have the same reference number. The two structures differ primarily in the manner in which a depletion layer is formed under the edge of gate electrode 24. In accordance with the inventive process, the previously described step of forming a N—region by means of introducing dopant atoms into substrate 14, has been omitted. The depletion region (indicated by the dashed line in FIG. 6) has been formed by electron inversion in channel region 40'. The induced depletion region functions in an identical manner to a P-N junction and forms a graduated electric field in channel region 40'. The depletion region is forced to extend under the edge of gate electrode 24 by the lateral diffusion of the Cesium ions during the heat cycle used to activate the dopant atoms in source and drain regions 34' and 36'. Transistor 38', shown in FIG. 6, has the advantage of having a depletion region and associated electric field formed at the edges of channel 40' by the introduction of electropositive charges into oxide layer 28. The inventive structure obviates the necessity of introducing dopant atoms into portions of channel 40' underlying the edges of gate electrode 24 to form a graduated electric field near source and drain regions 34' and 36'. The absence of dopant atoms in channel 40' increases the breakdown voltage of transistor 38' while still providing the graduated electric field necessary to prevent hot carrier injection into gate oxide layer 22 underlying gate electrode 24. The elimination of the N—doping in the inventive structure does not result in a loss of drive current because of electron inversion near the channel surface. Moreover, transistor 38' exhibits improved immunity to a fall off in threshold voltage as the length of channel 40' is reduced. Threshold voltage stability is maintained because the depletion region formed by the accumulated electrons near the surface of substrate 14 allow gate electrode 24 to retain voltage control over an area of channel 40' that directly corresponds to the width of gate electrode 24.

From the foregoing discussion it will be apparent to those skilled in the art that an analogous P-channel transistor can be formed by the inventive process wherein an electronegative atom is imparted to oxide layer 28. A corresponding positive charge image can be created in substrate 14 by the introduction of an electronegative element such as Iodine into oxide layer 28. When substrate 14 is doped to be N-type, the electric field created by the Iodine ions will attract positive charges or holes to the surface of substrate 14 creating a depletion region. To form a P-channel transistor, acceptor atoms are introduced to substrate 14 to form source and drain regions 34' and 36'.

Thus it is apparent that there has been provided, in accordance with the invention, an improved MOS transistor structure and a method for its fabrication which fully meets the objects and advantages set forth above. Although particular embodiments of the invention have been described in the foregoing description, it will be apparent to one skilled in the art that numerous modifications and variations can be made to the presented embodiments which still fall within the spirit and scope of the invention. For example, the invention is not to be limited to the particular fabrication sequence set forth to fully describe the invention. In particular, the N+ region can be formed prior to the formation of the N— region. Accordingly, it is intended that all such variations and modifications as fall within the scope of the appended claims and equivalents thereof be included within the invention.

We claim:

1. A method for forming an MOS transistor having improved transconductance and short channel characteristics comprising:

providing a semiconductor substrate region of a first conductivity type having a gate oxide formed thereon;

forming a gate electrode on a portion of said gate oxide leaving an exposed portion of said gate oxide;

oxidizing said gate electrode to round the edges of said gate electrode and to reduce the electric field near the edges;

implanting an electropositive impurity species of a first conductivity type selected from the group consisting of Rubidium and Cesium into said exposed portion of said gate oxide wherein a charge of a second conductivity type is induced in the surface of said substrate region;

forming a sidewall spacer adjacent said oxidized gate electrode; and forming regions of a second conductivity type in said substrate region aligned to said sidewall spacer.

2. The method of claim 1 wherein said sidewall spacer is comprised of silicon nitride.

3. The method of claim 1 further comprising oxidizing said substrate to form an oxide layer overlying said regions of a second conductivity type.

4. A method for forming an MOS transistor having improved transconductance and short channel characteristics comprising:
- providing an N-type semiconductor substrate region having a gate oxide formed thereon;
- forming a gate electrode on a portion of said gate oxide leaving an exposed portion of said gate oxide;
- oxidizing said gate electrode to round the edges of said gate electrode and to reduce the electric field near the edges;
- implanting iodine into said exposed portion of said gate oxide wherein a P-type conductivity type region is induced in the surface of said substrate region;
- forming a sidewall spacer adjacent said oxidized gate electrode; and
- forming P-type conductivity regions in said substrate region aligned to said sidewall spacer.

5. A method for forming an LDD structure in an MOS transistor comprising:
- providing a silicon substrate region of a first conductivity type having a gate oxide formed thereon;
- forming a gate electrode on said gate oxide;
- forming a first region of a second conductivity type in said substrate region aligned to said gate electrode;
- implanting into portions of said gate oxide overlying said first region of said substrate an electropositive impurity species of a first conductivity type selected from the group consisting of Rubidium and Cesium inducing a charge of a second conductivity type in the surface of said substrate region;
- forming sidewall spacers adjacent said gate electrode; and
- forming a second region of a second conductivity type in said substrate region aligned to said sidewall spacers.

6. The method of claim 5 wherein said sidewall spacer is comprised of silicon nitride.

7. The method of claim 5 further comprising oxidizing a portion of said gate electrode.

8. A method of forming an MOS transistor having improved immunity to short channel effects comprising:
- providing a silicon substrate region of a first conductivity type having a gate oxide formed thereon;
- forming a gate electrode on said gate oxide, said gate electrode being defined by distinct edges;
- oxidizing said substrate and said gate electrode to form a oxide layer overlying said substrate and said gate electrode, wherein said oxidizing rounds the edges of said gate electrode and becomes integral with said gate oxide on said substrate;
- imparting into said oxide layer an electropositive impurity species selected from the group consisting of Rubidium and Cesium of a first conductivity type inducing a charge of a second conductivity type in the surface of said substrate region;
- laterally diffusing said impurity species in said oxide layer such that said impurity species extends under an edge portion of said gate electrode;
- forming sidewall spacers adjacent said oxidized gate electrode; and
- forming a region of a second conductivity type in said substrate region aligned to said sidewall spacers.

* * * * *